United States Patent [19]

Hay

[11] Patent Number: 5,274,281
[45] Date of Patent: Dec. 28, 1993

[54] STATIC PLA WITH STATE MACHINE CONTROLLED BY MODEL OF BOTH MINTERM AND AN OUTPUT LINE

[75] Inventor: Ran Hay, Haifa, Israel
[73] Assignee: Intel Corporation, Santa Clara, Calif.
[21] Appl. No.: 875,661
[22] Filed: Apr. 29, 1992
[51] Int. Cl.⁵ .......................................... H03K 19/173
[52] U.S. Cl. .................................... 307/465; 307/480
[58] Field of Search ............. 307/465, 468, 469, 480, 307/443

[56] References Cited
U.S. PATENT DOCUMENTS

| | | | |
|---|---|---|---|
| 4,687,959 | 8/1987 | Eitrheim et al. | 307/465 |
| 4,728,827 | 3/1988 | Woo | 307/468 |
| 4,760,290 | 7/1988 | Martinez | 307/465 |
| 4,782,249 | 11/1988 | Engeler et al. | 307/469 |
| 5,023,775 | 6/1991 | Poret | 307/465 |
| 5,083,047 | 1/1992 | Horie et al. | 307/465 |
| 5,101,122 | 3/1992 | Shinonara | 307/465 |

*Primary Examiner*—Edward P. Westin
*Assistant Examiner*—Jon Santamauro
*Attorney, Agent, or Firm*—Blakely, Sokoloff, Taylor & Zafman

[57] ABSTRACT

A static PLA not requiring a device for leakage compensation for its minterms. Once evaluation of inputs is commenced, the evaluation is completed and the results stored in a latch even if the clock is halted during the evaluation. A dummy minterm and output line provide a timing signal to reinitiate precharge. No conduction paths to ground exist at the output lines of the array once evaluation is completed.

7 Claims, 3 Drawing Sheets

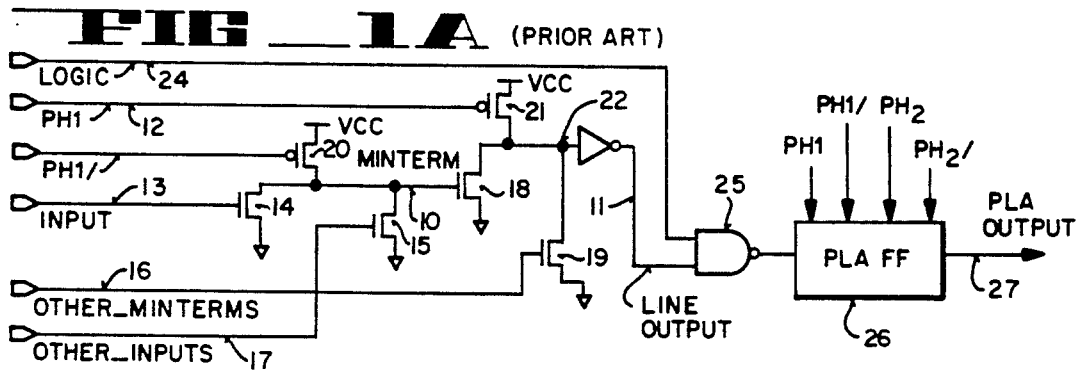
FIG_1A (PRIOR ART)
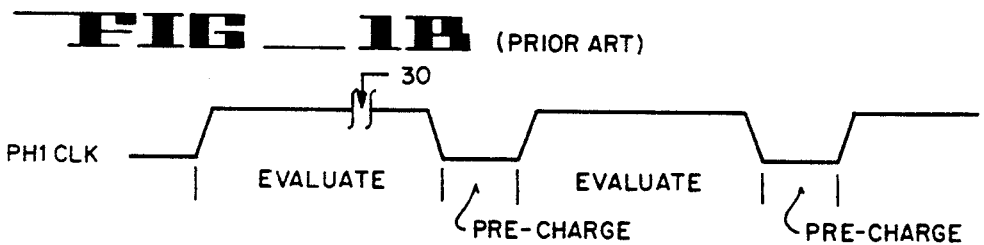
FIG_1B (PRIOR ART)
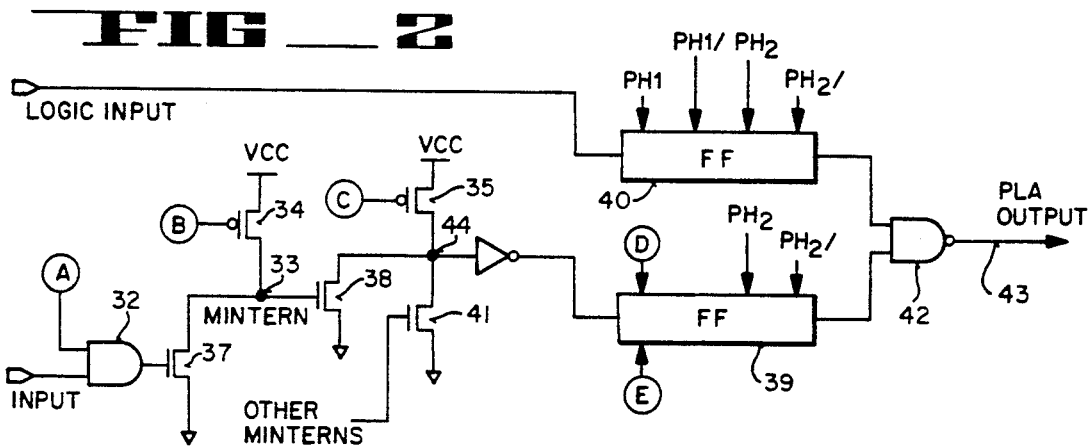
FIG_2
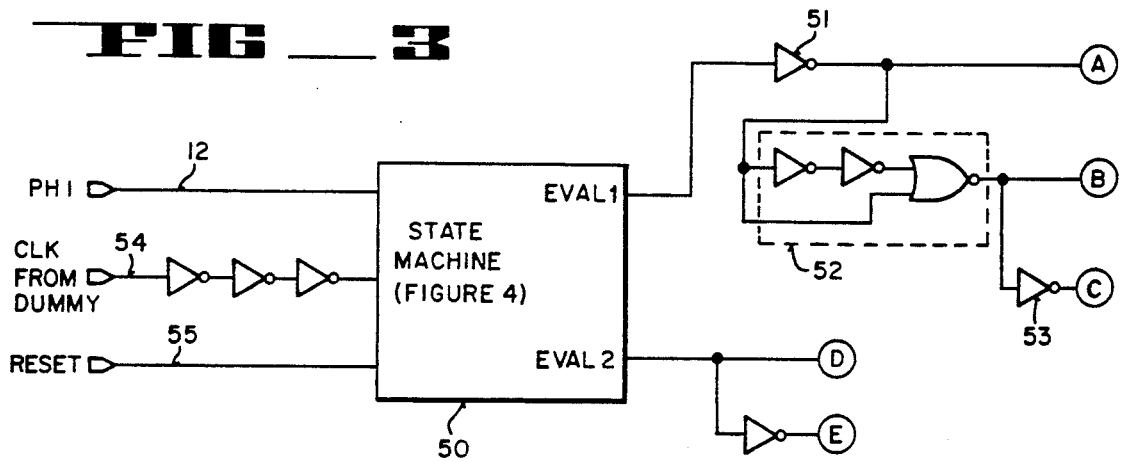
FIG_3

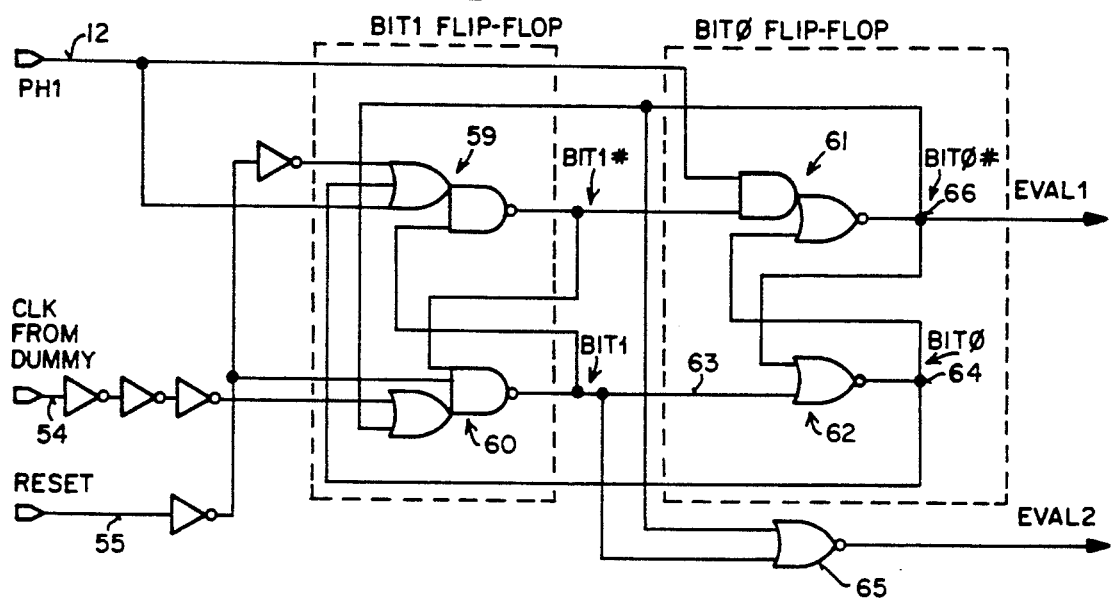
FIG_4
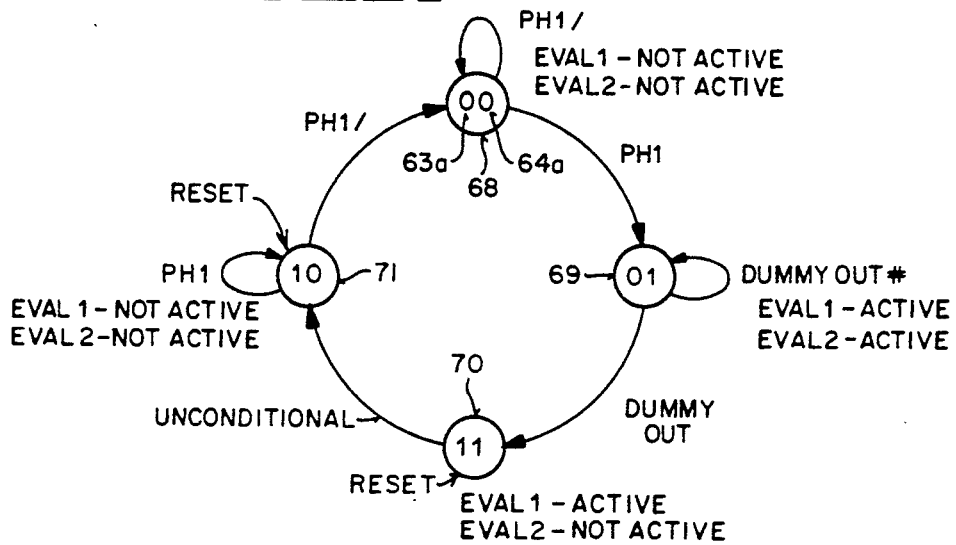
FIG_5A
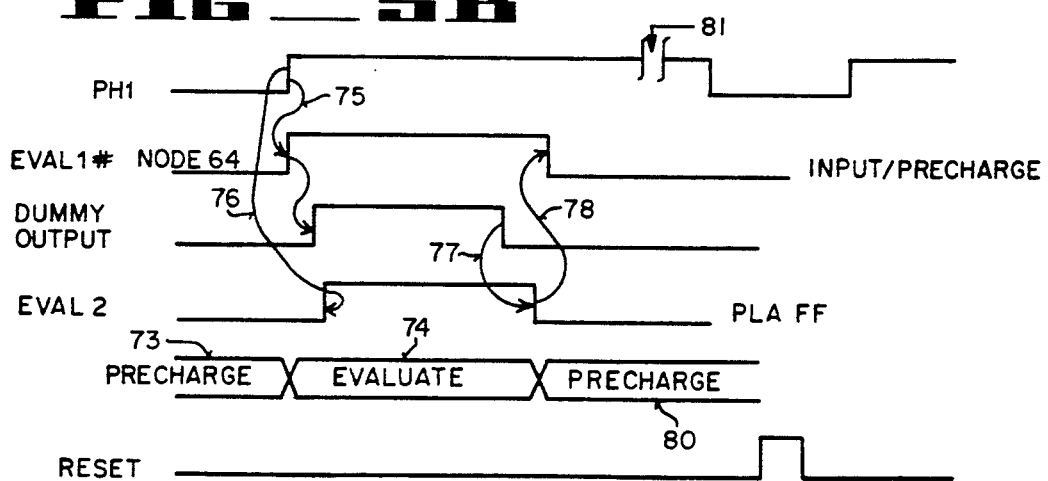
FIG_5B

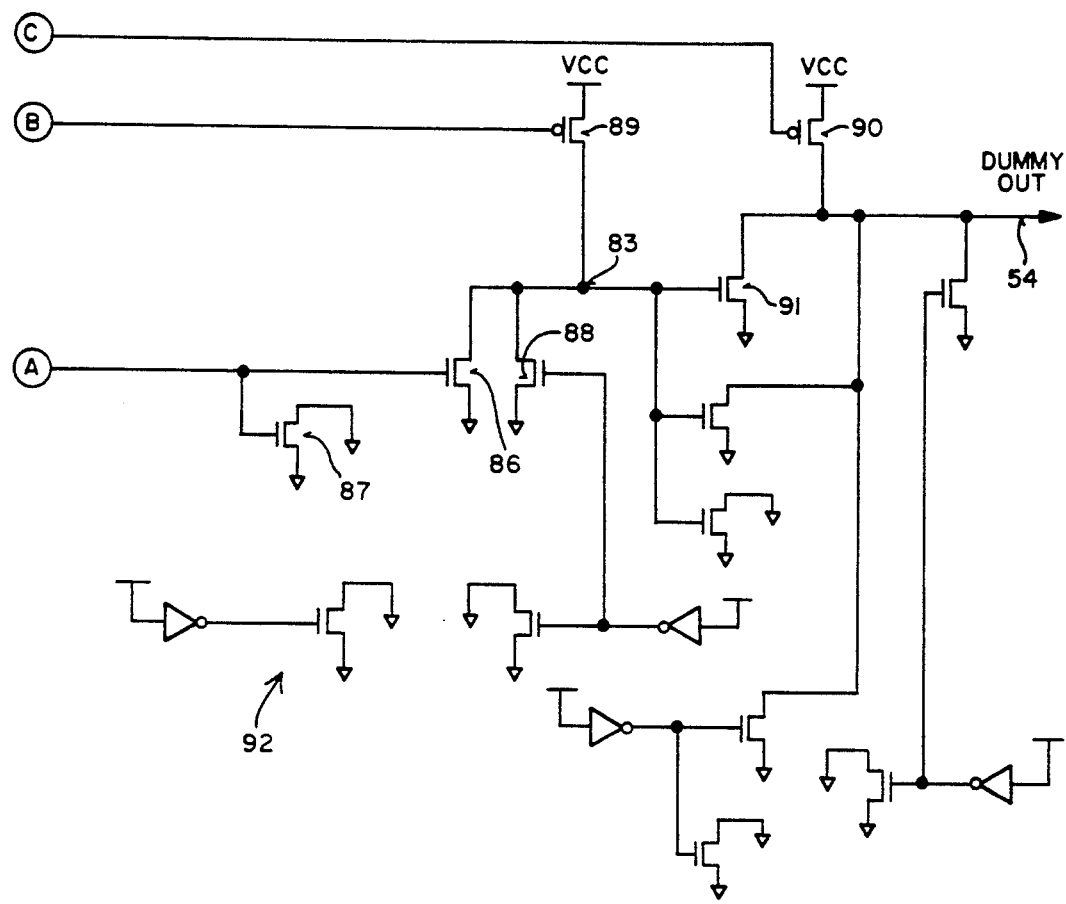
FIG_6 DUMMY ARRAY
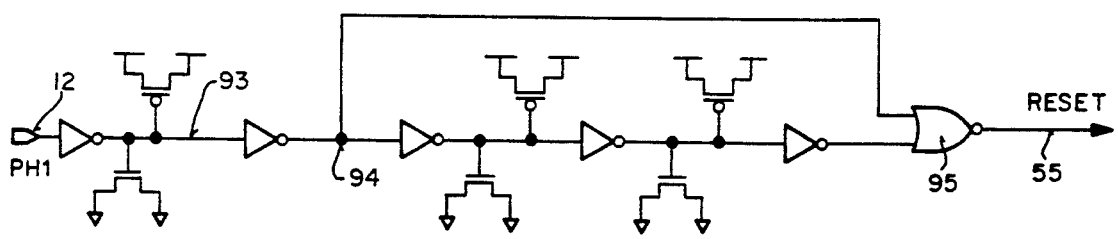
FIG_7 RESET GENERATOR
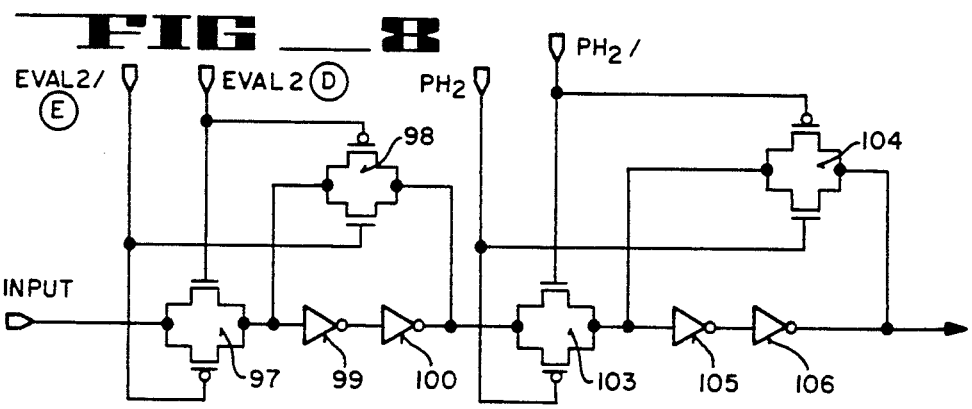
FIG_8

STATIC PLA WITH STATE MACHINE CONTROLLED BY MODEL OF BOTH MINTERM AND AN OUTPUT LINE

BACKGROUND OF THE INVENTION

1. Field of the Invention

The invention relates to the field of programmed and programmable logic arrays, particularly those which operate in a static mode.

2. Prior Art

Programmed logic arrays (PLAs) are well-known in the art and are commercially available. Some of these arrays employ dynamic circuitry while others operate using static circuits. The present invention grew out of the need to convert a dynamic PLA into a static PLA. (As used in this application "static" include circuits which are truly static and those which are pseudo-static).

In U.S. Pat. No. 4,728,827 there is a discussion of problems in designing a static PLA versus a dynamic PLA. One suggestion in that patent is to use a pull-up device which is always on. For example, applying this teaching to a minterm, once the minterm is pre-charged, a small device is used to compensate for leakage. In a large array, this has the disadvantage of slowing the operation of the array. This patent teaches using a delay circuit in a feedback loop to delay turning on the pre-charging circuit when the output of the logic gate is transitioning from high-to-low. This allows the minterm to be more quickly discharged.

As will be seen in the present invention, while used to convert a dynamic array into a static array has application to the fabrication of a static PLA. It provides a different solution for providing a fast, low power, static PLA than taught by the prior art known to the Applicant. The present invention uses a model or dummy array. While dummy arrays for PLA's are known in the prior art, they are not used in the manner of the present invention.

SUMMARY OF THE INVENTION

An improvement in a programmed logic array (PLA) which operates in response to a clocking signal (generally an externally controlled signal) and which includes a plurality of minterms and output lines in a data array is disclosed. The improvement includes the fabrication of a minterm and output line model (i.e., dummy array) for providing an electrical representation of the data array. A timing signal generation means is coupled to receive the clocking signal and coupled to the data array and model for providing a first signal to the data array and model for discontinuing precharging and initiating evaluation of inputs in response to the clocking signal. The signal also is used to initiate precharging in response to an output signal from the model. The output signal from the model occurs even if the clocking signal is halted or the clocking signal frequency is reduced. Consequently, the data array returns to the precharge state after the data inputs have been evaluated independently of the status of the clocking signal. A plurality of flip-flops receive the outputs of the data array and store them thus allowing the clocking signal to be interrupted without the loss of data.

Other aspects of the present invention will be obvious from the following Detailed Description of the Invention.

BRIEF DESCRIPTION OF THE DRAWINGS

FIG. 1A is an electrical schematic of a portion of a prior art PLA.

FIG. 1B is a timing diagram used to describe the operation of the array of FIG. 1A.

FIG. 2 is an electrical schematic of a portion of a PLA fabricated in accordance with the present invention.

FIG. 3 illustrates a timing signal generation means (state machine) used to provide timing signals for the data array of FIG. 2.

FIG. 4 is an electrical schematic of the state machine of FIG. 3.

FIG. 5A is a state diagram showing the states of the state machine of FIG. 4.

FIG. 5B illustrates a plurality of waveforms used to describe the operation of the state machine of FIG. 4 in conjunction with the data array of FIG. 2 and reset generator of FIG. 7.

FIG. 6 is an electrical schematic of an array model (dummy) used in conjunction with the state machine of FIG. 3.

FIG. 7 is an electrical schematic of a reset generator.

FIG. 8 is an electrical schematic of a flip-flop (latch pair) used in the data array of FIG. 2.

DETAILED DESCRIPTION OF THE INVENTION

A programmed logic array (PLA) is described. In the following description, numerous specific details are set forth such as specific circuitry in order to provide a thorough understanding of the present invention. It will be obvious to one skilled in the art that the present invention may be practiced without these specific details. In other instances, well-known circuitry such as gates have not been set forth in detail in order not to unnecessarily obscure the present invention.

In its currently preferred embodiment, the present invention in realized as a PLA used in conjunction with a processor and consequently is incorporated on the chip with the processor. The chip which includes the PLA is fabricated using complementary metal-oxide-semiconductor (CMOS) technology. Any one of a plurality of well-known CMOS processes may be used to realize the present invention.

Prior Art Dynamic PLA of FIG. 1A

As previously mentioned, the present invention was developed for converting a prior art dynamic PLA into a static PLA. The specific PLA that underwent the conversion is shown in part in FIG. 1A.

The data array portion of FIG. 1A includes a minterm 10, charged through the p-channel transistor 20, and selectively discharged based through transistors such as transistors 14 and 15 depending upon the state of inputs coupled to input lines 13 and 17, respectively. The charge or lack thereof on the minterm 10 controls the conduction of the transistor 18. Signals from the other minterms are coupled in parallel such as shown by line 16 and transistor 19. The states of the minterms determines whether or not node 22 remains high or low and accordingly determines the output on line 11. The data array output for the single line of FIG. 1A is coupled to one input terminal of the NAND gate 25, the other input of this gate receives a logic input from line 24. The output of the gate is clocked through a flip-flop 26 under control of the timing signals PH1 and PH2. The output of the PLA is shown on line 27.

The timing signals PH1 and PH2 define evaluate and precharge periods of sufficient duration to allow complete charging and discharging as needed for the PLA operation. The duration of the evaluate period is not so long as to allow a precharged minterm to leak away its charge except under authority of an input. Generally, the PH1 and PH2 clocking signals are externally controlled within well-defined parameters. For the PLA of FIG. 1A the PH1 and PH2 signals are periodic; that is, for example, they are not halted when valid data which must be preserved is on the input lines.

In operation, as shown by the waveform of FIG. 1B, first the minterm 10 is charged through the transistor 20. During this precharging period, transistor 21 does not conduct. During the evaluation period transistor 20 stops conducting while transistor 21 conducts. The state of the inputs to the minterm and the state of the other minterms determines the array line output and this output along with the logic signal on line 24 determines the final PLA line output. The clocking signal PH1 of FIG. 1B has an evaluate period during which transistor 20 is not conducting and transistor 21 conducts and a precharge period where the converse is true. In actual use, a second timing signal PH2, synchronized with PH1, is used by the "slave" portion of the master/slave flip-flops comprising flip-flop 26.

If for some reason the timing signal PH1 is halted during the evaluation period (i.e., maintained in its high state) for an indeterminate period of time as shown by break 30 of FIG. 1B, data may be lost from the array of FIG. 1A because of the dynamic nature of this array. Note, node 10 floats if input signals are low. Consider first the minterm 10, charged at the beginning of the evaluate period, if this minterm is not discharged by one of the inputs, a prolonged evaluate period will cause the minterm to discharge because of leakage thereby losing data. Also, during the evaluation period the transistor 21 is conducting causing a substantial current drain if, for example, transistor 19 is conducting. For this reason, the circuit of FIG. 1A operates most satisfactorily when the evaluate period is no greater than a predetermined period.

In some applications, it may be desirable to slow the frequency or to halt the clock (e.g., for power-down modes). The circuit of FIG. 1A, as discussed above, is not suited for such operation and, as described below, was modified so that it would retain data when the clocking signal is halted.

PLA of the Present Invention

Referring to FIG. 2, a minterm and output line forming a portion of a data array as used in the currently preferred embodiment of the invention is shown. Again, a minterm 33 is charged (precharged) through a p-channel transistor 34. The charge on the minterm and other minterms determines whether node 44 will remain high or low (e.g., through transistors 38 and 41). Node 44 is pulled to $V_{cc}$ through the p-channel transistor 35 during the evaluation period.

Three timing signals: A, B and C, control the precharge/evaluation periods as will be described. The input signals applied through gates such as AND gate 32 is gated by the A signal to the gate of the transistors 37. The B signal controls the precharging of the minterms and the C signal controls the pulling of the output lines to the $V_{cc}$ potential. The timing signals D and E control the transfer and latching of the data into the flip-flop 39.

Unlike the array of FIG. 1, the results of the evaluation of the array are stored in a separate flip-flop 39 from the logic signal which is stored in flip-flop 40. These stored signals are combined in a NAND gate 42 before being coupled to the PLA output line 43. The flip-flop 40 comprises two series latches operating under control of the PH1 and PH2 signals (the two signals used in the prior art array of FIG. 1.) The flip-flop 39 also comprises two series latches, however, it is controlled by the EVAL2 signal and the PH2 clocking signal. These flip-flops are shown in detail in FIG. 8.

Operation of the Circuit of FIG. 2

Assume that the minterm 33 has been charged and that the evaluate period has begun (PH1 goes high). When this occurs, the inputs are evaluated and coupled to the flip-flop 39. The logic input signal is coupled to the flip-flop 40. Now timing signals, described in conjunction with FIGS. 3–7, cause the array to go back to its precharge state even if the PH1 clock remains high. The line 43 will be valid when PH2 goes high. During extended PH1, one latch in flip-flop 39 saves the old data while the master latch of flip-flop 39 saves the new data, and updates the output when PH2 is active. In this way, charge on minterm 33 is not lost before the evaluation is completed, rather the results of the evaluation are safely stored. Note that there is no direct current path for an extended period of time, for example, through transistors 35 and 37.

State Machine of FIGS. 3 and 4

Referring to FIG. 3, the timing signals A, B, C, D and E are generated from a timing signal generator which, in the currently preferred embodiment, comprises a state machine 50. The schematic for the state machine is shown in FIG. 4. The state machine receives as inputs the PH1 clocking signal on line 12, a clocking signal from a dummy array which will be described in conjunction with FIG. 6, and a reset signal on line 55 generated by the circuit of FIG. 7. The state machine provides two outputs: evaluation signal 1 (EVAL1) which is active in its low state and evaluation signal 2 (EVAL2) which is active in its high state. Inverter 51 drives a high capacitance load (i.e., a high number of inputs to NAND gate).

The EVAL1 signal, after passing through an inverter 51, provides the A timing signal coupled to the AND gate 32 and like gates of the array. The A signal, after passing through the inverters and NOR gate shown within the dotted line 52, provides the B signal. Circuit 52 is used to delay the falling edge of B and the rising edge of C at the end of the evaluation. This insures the beginning of precharge will be after disconnecting the inputs and the capture of the PLA output in the flip-flop 39. This signal controls the precharging of the minterms in the array. The B signal, after passing through the inverter 53, provides the C signal. This signal provides the pull-up for the output lines of the array. (The A, B and C signal are used both for the data array and the dummy array.) The EVAL2 signal and its complement provide the D and E signals, respectively, and are coupled to the flip-flop 39 of FIG. 2 and like flop-flops in the data array.

Referring now to FIG. 4, the state machine includes four groups of gates: 59, 60, 61 and 62. One bistable circuit is formed by gates 59 and 60 and another by gates 61 and 62. Gates 60 and 59 receive the complement of the reset signal and the reset signal, respectively. Gate 60 receives the complement of the dummy array output signal. Gates 59 and 61 are coupled to receive the PH1 signal (line 12). Node 66 provides the EVAL1 signal (states 01 and 11). The EVAL2 signal is provided at the output of the NOR gate 65 (state 01 only); gate 65 receives as inputs the EVAL1 signal and the signal from node 63.

Referring to the state diagram of FIG. 5A, the four states 68, 69, 70 and 71 for the circuit of FIG. 4 are illustrated. The first bit for each of the states shown for state 68 as bit 63a is the signal on node 63 of FIG. 4. The bit 64a is the potential on node 64. (Node 64 is the complement of the EVAL1 signal.)

In state 68 (idle state) neither EVAL1 nor EVAL2 are active. This is the period when precharging occurs during states 10 and 00. For instance, see period 73 of the precharge/evaluate waveform of FIG. 5B.

When PH1 becomes active the state machine changes to state 69 where EVAL1 and EVAL2 are active. During this period the data array inputs are evaluated as indicated by period 74 in FIG. 5B.

In FIG. 5B the potential on node 64 (the complement of the EVAL1 signal) is shown, and as can be seen by line 75, the EVAL1 \ signal follows the PH1 signal. Similarly, the EVAL2 signal follows the PH1 signal as shown by line 76 of FIG. 5B.

As will be described later in more detail, a dummy array (also referred to as a "model") provides an output signal on line 54. When this signal drops in potential, there is a change of state to state 70. In state 70, the EVAL2 signal becomes inactive, although EVAL1 signal remains active. State 70 is a transitory state; a transition immediately occurs to state 71. State 70 assures that the output of the data array is locked into the flip-flops such as flip-flop 39 prior to the time that the inputs are cut off and the precharging of the minterms begins again. As seen by line 77 of FIG. 5B, the dummy output triggers the dropping in potential of the EVAL2 signal as is indicated by line 78, in turn, this causes the EVAL1 signal to become inactive. Once in state 71, precharging begins again.

When the PH1 signal drops in potential, there is a transition from state 71 to 68. The generation of the reset signal is described in conjunction with FIG. 7. This reset signal is generated for each array evaluation cycle.

Note particularly from FIG. 5B, that even if PH1 signal is halted (i.e., remains high) as shown by break 81 in the PH1 waveform, precharging is initiated, and importantly, data is not lost since it has been evaluated and the results of the evaluation stored in the flip-flops.

The reset is needed to initial the value of the state machine. The above circuit is used rather than the reset input to the chip since the PLA must be reset independently of the reset input.

Dummy Array

A model of a minterm and output line is used to provide the dummy out signal on line 54. It is this signal that ends the evaluation period and places the array in the precharge mode. The model of the minterm and output line of FIG. 6 duplicates the structure of an actual minterm and output line of the array and therefore provides a mean for determining when the evaluation has been completed within the array. As is known in the art, dummies or models provide inherent compensation for process variations, temperature, and other variables. The model of FIG. 6 was not used with the dynamic array of FIG. 1 but rather added as part of the conversion of the array to a static array.

The circuit of FIG. 6 duplicates, as mentioned, a minterm and output line of the data array. The A signal duplicates an input to the model by being coupled to the transistor 86. The structure 87 provides capacitance loading to duplicate an actual input line. Transistor 86 discharges the dummy minterm 83 for each array cycle. The B signal, coupled to the gate of the p-channel transistor 89, precharges the minterm 83 for each cycle. Other structures such as transistor 88 are used to duplicate other minterms coupled to the minterm 83. There are also structures, such as structure 92, not directly electrical connection to the dummy minterm and output line duplicating the affects of adjacent structures in the array itself. (The dummy array is on the outside edge of the data array and thus, structures such as structure 92 aid in duplicating the couplings experienced by a minterm and output line in the data array itself.)

The transistor 90 conducts during the evaluation period since its gate is coupled to receive the C signal. This charges the output line 54 providing the signal used by the state machine to terminate the evaluation period and initiate the precharge period. Once precharging commences again the minterm 83 is charged, transistor 91 conducts, discharging the output line 54.

Reset Generator of FIG. 7

As shown in FIG. 5B, once the PH1 signal drops in potential (after evaluation is completed), a reset signal is generated on line 55.

Referring now to FIG. 7, the complement of the PH1 signal is coupled to line 93. The gates of the n-channel and p-channel transistors are coupled to the line 93 provide capacitance loading on this line. This capacitance introduces a delay in the coupling of the signal from line 93 to node 94. This delay determines the period of time between the falling edge of the PH1 signal and the leading edge of the reset pulse. Note 94 is directly coupled to one input terminal of the NOR gate 95. Node 94 is also coupled to the other input terminal of this gate through three inverters and additional gate structures that provide capacitance. In effect, the complement of the signal at node 94 is applied to the other input terminal of the gate 95 but delayed in time. This delay determines the pulse width of the reset pulse.

When the PH1 signal is in its high state, the output of gate 95 is low. When the transition of the PH1 signal occurs to the low state, the potential on node 94 drops after some delay. This drop on node 94 is immediately sensed at the input to the gate 95 because of the direct connection between the node and gate. When node 94 first drops in potential, both input to gate 95 are low and consequently, the potential on line 55 rises giving rise to the reset pulse. When the drop in potential on node 94 propagates to the input of gate 95 through the inverters and capacitors, the output of gate 95 drops in potential ending the pulse. Note that on the rising edge of the PH1 signal, there is no corresponding pulse since the rise in potential on node 94 is immediately coupled to the gate 95, and with both inputs to the gate high, no rise occurs at the gate's output.

Flip-Flop of FIG. 8

As previously mentioned, the master/slave flip-flop arrangement of the prior art (FIG. 1) is replaced with two separate flip-flops 39 and 40 as shown in FIG. 2. Each of these flip-flops comprises two series latches, one of which is detailed in FIG. 8.

The flip-flop 40 allows the logic input to be moved to the gate 42 under control of the PH1 and PH2 signals. In contrast, the flip-flop 39 causes the evaluated inputs to the data array to be locked into the flip-flop 39 even though the PH1 signal may be halted and then to be moved to the gate 42 under the control of the PH2 signal which occurs once the PH1 signal resumes.

Each one of the series latches comprises a typical latch structure shown in FIG. 8 by, for example, inverters 99 and 100 with feedback provided by the n-channel and p-channel transistors 98. The input (output of data array) is coupled to the latch through transistors 97. As shown in FIG. 8, the input to the latch is coupled to the latch under the control of the EVAL2 signal (D signal). Once the evaluation period has ended, the D signal drops in potential and the E signal rises in potential causing transistors 98 to conduct and fixing the data in the latch.

The second stage of the latch includes the input transistors 103, the inverters 105 and 106 and the feedback path through transistors 104. Data is moved from the first latch to the second latch when the PH2 signal rises in potential. This places the data at the input to gate 42 of FIG. 2.

The flip-flop 40 of FIG. 2 is identical to the two series latches shown in FIG. 8 except that the first latch operates under the control of the PH1 signal.

Thus, a static PLA has been disclosed. The structure used in the PLA is suitable for converting a dynamic array such as shown in FIG. 1A to a static or quasistatic array.

I claim:

1. In a logic array having a plurality of minterms and output lines and operating in response to a clocking signal improvement comprising:
   a model of both a minterm and output line for electrically representing the array; and,
   a state machine having four states coupled to receive the clocking signal, and coupled to the array and model, for providing a first signal to the array in response to the clocking signal for discontinuing precharging and evaluating inputs to the array, and in response to an output signal from the model for initiating precharging.

2. The improvement defined by claim 1 including a plurality of flip-flops coupled to the output lines of the array, the flip-flops operating under control of a second timing signal provided by the state machine.

3. The improvement defined by claim 2 wherein the second timing signal is controlled by the clocking signal and the output signal of the model.

4. The improvement defined by claim 3 wherein the second timing signal changes state before the first signal in response to the change of state of the output signal of the model.

5. In a logic array operating in response to a clocking signal having a plurality of minterms and output lines an improvement comprising:
   a plurality of first flip-flops coupled to the output lines;
   a plurality of second flip-flops each coupled to receive a logic input signal, the second flip-flops being coupled to receive the clocking signal;
   a plurality of gates each gate being coupled to one of the first flip-flops and one of the second flip-flops;
   a state machine having four states coupled to receive the clocking signal for providing control signals to discontinue and initiate precharging of the minterms, to initiate the evaluation of inputs to the array and to control the transfer of data in the first flip-flops, the transfer of data to the first flip-flops occurring independently of a change in the clocking signal once the evaluation of the inputs to said array is initiated; and
   a model of both a minterm and output line for electrically representing the array, the model being coupled to the state machine.

6. The improvement defined by claim 5 wherein each of the first flip-flops comprise two series latches.

7. The improvement defined by claim 5 wherein each of the second flip-flops comprise two series latches.

* * * * *

UNITED STATES PATENT AND TRADEMARK OFFICE
CERTIFICATE OF CORRECTION

PATENT NO. : 5,274,281
DATED : December 28, 1993
INVENTOR(S) : Ran Hay

It is certified that error appears in the above-indentified patent and that said Letters Patent is hereby corrected as shown below:

Column 6, line 41, delete "Note" insert --Node --.

Signed and Sealed this

Twenty-seventh Day of June, 1995

Attest:

BRUCE LEHMAN

*Attesting Officer*    *Commissioner of Patents and Trademarks*